United States Patent
Marui et al.

(10) Patent No.: US 11,557,674 B2
(45) Date of Patent: Jan. 17, 2023

(54) SEMICONDUCTOR DEVICE AND METHOD FOR MANUFACTURING THE SAME

(71) Applicants: NISSAN MOTOR CO., LTD., Yokohama (JP); RENAULT S.A.S., Boulogne-Billancourt (FR)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP); Keisuke Takemoto, Kanagawa (JP)

(73) Assignees: NISSAN MOTOR CO., LTD., Yokohama (JP); RENAULT s.a.s., Boulogne-Billancourt (FR)

( * ) Notice: Subject to any disclaimer, the term of this patent is extended or adjusted under 35 U.S.C. 154(b) by 0 days.

(21) Appl. No.: 17/262,001

(22) PCT Filed: Jul. 27, 2018

(86) PCT No.: PCT/IB2018/001002
§ 371 (c)(1),
(2) Date: Jan. 21, 2021

(87) PCT Pub. No.: WO2020/021298
PCT Pub. Date: Jan. 30, 2020

(65) Prior Publication Data
US 2021/0313466 A1 Oct. 7, 2021

(51) Int. Cl.
*H01L 29/10* (2006.01)
*H01L 29/78* (2006.01)
(Continued)

(52) U.S. Cl.
CPC ...... *H01L 29/7825* (2013.01); *H01L 29/0878* (2013.01); *H01L 29/1095* (2013.01);
(Continued)

(58) Field of Classification Search
CPC ......... H01L 29/08; H01L 29/10; H01L 29/16; H01L 29/42; H01L 29/66; H01L 29/78;
(Continued)

(56) References Cited

U.S. PATENT DOCUMENTS

2006/0256487 A1* 11/2006 Kishimoto .......... H01L 29/7813
257/E29.257
2007/0249142 A1* 10/2007 Hisanaga ............ H01L 29/0634
257/E29.066
(Continued)

FOREIGN PATENT DOCUMENTS

JP 2002-319680 A 10/2002
JP 2009152442 * 7/2009 ....... H01L 29/66659

OTHER PUBLICATIONS

Wen-Shan Lee et al., "Design and Fabrication of 4H SiC Lateral High-Voltage Devices on a Semi-Insulating Substrate", IEEE Transactions on Electron Devices, vol. 59, No. 3, Mar. 1, 2012, pp. 754-760.

*Primary Examiner* — Fazli Erdem
(74) *Attorney, Agent, or Firm* — Foley & Lardner LLP

(57) ABSTRACT

A semiconductor device includes: a substrate (10); a semiconductor layer (20) disposed on a main surface of this substrate (10); and a first main electrode (30) and a second main electrode (40), which are disposed on the substrate (10) separately from each other with the semiconductor layer (20) sandwiched therebetween and are individually end portions of a current path of a main current flowing in an on-state. The semiconductor layer (20) includes: a first conductivity-type drift region (21) through which a main current flows; a second conductivity-type column region (22) that is disposed inside the drift region (21) and extends in parallel to a current path; and an electric field relaxation region (23) that is disposed in at least a part between the drift region (21) and the column region (22) and is either a (Continued)

low-concentration region in which an impurity concentration is lower than in the same conductivity-type adjacent region or a non-doped region.

14 Claims, 12 Drawing Sheets

(51) Int. Cl.
    *H01L 29/08*     (2006.01)
    *H01L 29/16*     (2006.01)
    *H01L 29/423*     (2006.01)
    *H01L 29/66*     (2006.01)

(52) U.S. Cl.
    CPC ...... *H01L 29/1608* (2013.01); *H01L 29/4236* (2013.01); *H01L 29/66068* (2013.01); *H01L 29/66704* (2013.01)

(58) Field of Classification Search
    CPC ............. H01L 29/0878; H01L 29/1095; H01L 29/1608; H01L 29/4235; H01L 29/66068; H01L 29/7813; H01L 29/7825
    USPC .......................................................... 257/77
    See application file for complete search history.

(56) References Cited

U.S. PATENT DOCUMENTS

| | | | |
|---|---|---|---|
| 2008/0173935 A1* | 7/2008 | Miyajima | ............ H01L 29/404 438/479 |
| 2011/0210391 A1* | 9/2011 | Kitagawa | ............ H01L 29/7825 257/331 |
| 2015/0115286 A1* | 4/2015 | Takeuchi | ............ H01L 29/158 257/77 |

* cited by examiner

SEMICONDUCTOR DEVICE AND METHOD FOR MANUFACTURING THE SAME

TECHNICAL FIELD

The present invention relates to a semiconductor device and a method for manufacturing the same.

BACKGROUND ART

In order to achieve a high withstand voltage and a low on-resistance, a semiconductor device with a super junction (SJ) structure has been developed (see Patent Literature 1). The SJ structure is a structure in which n-type drift regions and p-type column regions are arranged alternately with each other to periodically form pn junctions. In the semiconductor device with the SJ structure, even if a concentration of N-type impurities in the drift regions through which a main current flows is increased to lower the on-resistance, the withstand voltage thereof can be kept high since the drift regions are depleted at the time of reverse bias by depletion layers which extend from the pn junction.

CITATION LIST

Patent Literature

Japanese Patent Laid-Open Publication No. 2002-319680

SUMMARY OF INVENTION

Technical Problem

However, there has been a problem that the withstand voltage of the semiconductor device decreases by the fact that an electric field concentrates to boundaries between the drift regions and the column regions at the time of reverse bias.

The present invention has been made in consideration of the above-described problem, and has an object to provide a semiconductor device that has a super junction structure and is capable of suppressing the decrease of the withstand voltage and to provide a method for manufacturing the semiconductor device.

Solution to Problem

A semiconductor device according to an aspect of the present invention includes, in at least a part between a drift region and a column region which constitute a super junction structure, an electric field relaxation region that is either a low-concentration region in which an impurity concentration is lower than in a same conductivity-type adjacent region or a non-doped region.

A method for manufacturing a semiconductor device according to another aspect of the present invention includes forming a drift region and a column region by ion-implanting impurities into a substrate, wherein an electric field relaxation region that is either a low-concentration region in which an impurity concentration is lower than in a same conductivity-type adjacent region or a non-doped region is formed in at least part between the drift region and the column region.

Advantageous Effects of Invention

According to the present invention, a semiconductor device that has a super junction structure and is capable of suppressing the decrease of the withstand voltage and a method for manufacturing the semiconductor device can be provided.

DESCRIPTION OF EMBODIMENTS

Figure 1:
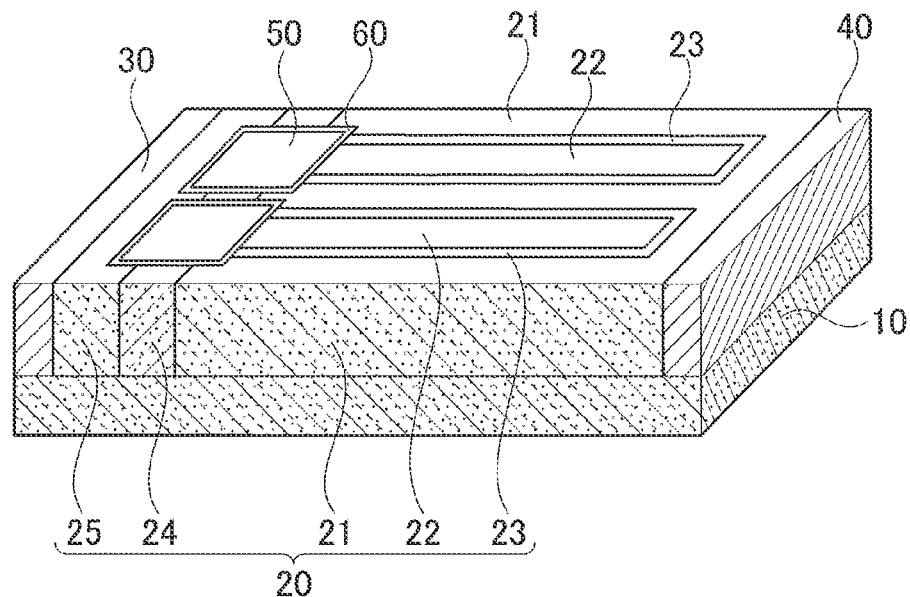
FIG. 1 is a schematic perspective view illustrating a configuration of a semiconductor device according to a first embodiment of the present invention.

Hereinafter, a description will be given of embodiments with reference to the drawings. In the description of the drawings, the same reference numerals are assigned to the same portions, and a description thereof is omitted. However, the drawings are schematic, and relationships between thicknesses and plane dimensions, ratios of thicknesses of the respective layers, and the like include portions different from actual ones. Moreover, between the drawings, portions where dimensional relationships and ratios therebetween are different from each other are also included.

First Embodiment

As illustrated in FIG. 1, a semiconductor device according to a first embodiment of the present invention includes: a substrate 10; a semiconductor layer 20 disposed on a main surface of the substrate 10; and a first main electrode 30 and a second main electrode 40, which are disposed on the substrate 10 separately from each other with the semiconductor layer 20 sandwiched therebetween. The first main electrode 30 and the second main electrode 40 are individually end portions of a current path of a main current flowing through the semiconductor device in an on-state.

The semiconductor layer 20 includes: a first conductivity-type drift region 21 through which the main current flows; and second conductivity-type column regions 22 and electric field relaxation regions 23, which are disposed inside the drift region 21. Each of the electric field relaxation regions 23 is disposed in at least a part between the drift region 21 and the column region 22. The column regions 22 extend in parallel to the current path. An SJ structure is composed of the drift regions 21 and the column regions 22. The electric field relaxation regions 23 are low-concentration regions in which an impurity concentration is lower than in adjacent regions with the same conductivity type, or non-doped regions which are not intentionally doped with impurities. In the semiconductor device illustrated in FIG. 1, the electric field relaxation regions 23 are disposed in contact with side surfaces of the column regions 22, which face the second main electrode 40, and are disposed in contact with side surfaces of the column regions 22 facing the drift region 21 in parallel to the current path.

The first conductivity type and the second conductivity type are conductivity types opposite to each other. That is, if the first conductivity type is the n type, then the second conductivity type is the p-type, and the first conductivity type is the p-type, then the second conductivity type is the n-type. Hereinafter, a description will be given of the case where the first second conductivity type is the n-type and the second conductivity type is the p-type.

The semiconductor layer 20 illustrated in FIG. 1 further includes: a second conductivity-type well region 24 disposed between the first main electrode 30 and respective end portions of the drift region 21 and the column regions 22; and a first conductivity-type source region 25 disposed between the well region 24 and the first main electrode 30. The well region 24 contacts the drift region 21 and the column regions 22. The source region 25 electrically connects to the first main electrode 30.

Moreover, the semiconductor device illustrated in FIG. 1 further includes control electrodes 50 embedded in the semiconductor layer 20. The control electrodes 50 face the drift region 21, the well region 24 and the source region 25 with gate insulating films 60 interposed therebetween. The semiconductor device according to the first embodiment operates as a transistor that controls the main current by the control electrodes 50. That is, the semiconductor device illustrated in FIG. 1 is a MOSFET in which the first main electrode 30 is a source electrode, the second main electrode 40 is a drain electrode, and the control electrodes 50 are gate electrodes. The first main electrode 30 makes an ohmic connection to the source region 25. The second main electrode 40 makes an ohmic connection to the drift region 21.

A plurality of gate trenches are formed so as to reach the substrate 10. Opening portions of the gate tranches lie astride upper surfaces of the source region 25, the column regions 22 and the well region 24. The gate insulating films 60 are disposed on inner wall surfaces of the gate trenches, and the control electrodes 50 are disposed inside the gate trenches so that a periphery thereof is surrounded by the gate insulating films 60. Between the gate trenches, the drift region 21 and the well region 24 connect to each other, and the well region 24 and the source region 25 connect to each other. At the time of an on-operation, an inversion layer is formed in a channel region of the well region 24, which contacts the gate insulating films 60.

The semiconductor device illustrated in FIG. 1 has such an SJ structure in which a plurality of the drift regions 21 and a plurality of the column regions 22 are arranged alternately with each other along a direction perpendicular to the current path. Therefore, at the time of reverse voltage application (at the time of reverse bias), the drift region 21 and the column regions 22 are depleted by depletion layers which extend from pn junctions formed on interfaces between the drift region 21 and the column regions 22. Therefore, a high withstand voltage is obtained for the semiconductor device.

Further, in the semiconductor device illustrated in FIG. 1, the electric field relaxation regions 23 are disposed between the drift region 21 and the column region 22. When the electric field relaxation regions 23 axe not non-doped regions, the electric field relaxation regions 23 are of the same conductivity type as that of either of the drift region 21 and the column regions 22, which are adjacent thereto; however, the impurity concentration of the electric field relaxation regions 23 is lower than an impurity concentration of the regions of the same conductivity type. That is, when the electric field relaxation regions 23 are of the first conductivity type, the impurity concentration of the electric field relaxation regions 23 is lower than the impurity concentration of the drift region 21. Meanwhile, when the electric field relaxation regions 23 are of the second conductivity type, the impurity concentration of the electric field relaxation regions 23 is lower than the impurity concentration of the column regions 22. Therefore, by the electric field relaxation regions 23, electric field concentration in boundary regions where the drift region 21 and the column regions 22 face each other is relaxed. A width of the electric field relaxation regions 23 is, for example, approximately 0.1 μm to 0.3 μm.

Note that, when the drift region 21 is of the n-type, and the electric field relaxation regions 23 is of the p-type, then the impurity concentration of the electric field relaxation regions 23 may be higher than that of the drift region 21. Moreover, when the column regions 22 are of the p-type, and the electric field relaxation regions 23 are of the n-type, then the impurity concentration of the electric field relaxation regions 23 may be higher than the column regions 22.

Hereinafter, a description will be given of basic operations of the semiconductor device illustrated in FIG. 1.

In an on-operation, a potential of the control electrodes 50 is controlled in a state in which a positive potential is applied to the second main electrode 40 while taking a potential of the first main electrode 30 as a reference, whereby the semiconductor device operates as a transistor. That is, a voltage between the control electrodes 50 and the first main electrode 30 is set to a predetermined threshold voltage or more, whereby inversion layers are formed in channel regions of the well region 24 on side surfaces of the control electrodes 50. Thus, the semiconductor device turns to an on-state, and the main current flows between the first main electrode 30 and the second main electrode 40.

Meanwhile, in an off-operation, the voltage between the control electrodes 50 and the first main electrode 30 is set equal to or less than the predetermined threshold voltage. Thus, the inversion layer disappears, and the main current is shielded.

In an off-state, the depletion layers spread from the interfaces between the drift region 21 and the column regions 22, and when the reverse voltage increase to some extent, the drift region 21 and the column regions 22 turn to a pinch-off state. Thus, an electric field intensity of the drift region 21 and the column regions 22 forms a uniform rectangular distribution, and a maximum electric field applied to the semiconductor device decreases greatly. Thus, the withstand voltage of the semiconductor device improves.

In order to obtain a high withstand voltage by completely depleting the SJ structure in the off-state, it is required to set, to approximately 1, a ratio of a total amount of n-type impurities of the n-type semiconductor region and a total amount of p-type impurities of the p-type semiconductor regions. Therefore, the concentration Nd of the n-type impurities of the drift region 21, the concentration Na of the p-type impurities of the column regions 22, a width Wn of the drift region 21, and a width Wp of the column regions 22 are set so as to satisfy the following Equation (1).

$$Na \times Wp = Nd \times Wn \qquad (1)$$

The width Wn and the width Wp are widths in a direction where the drift region 21 and the column regions 22 are arranged alternately with each other.

The impurity concentrations of the drift region 21 and the column regions 22 are set so as to satisfy Equation (1), whereby the drift region 21 and the column regions 22 are depleted by the depletion layers which extend from the pn junctions. Therefore, the withstand voltage of the semiconductor device is high. In addition, a resistance value of the drift region 21 can be reduced.

However, at the time of reverse bias, the electric field is likely to concentrate on the pn junctions in the interfaces between the drift region 21 and the column regions 22. This is because the relationship of Equation (1) is not established in regions close to the pn junctions, and electric charges in the n-type semiconductor region and the p-type semiconductor regions are not balanced. The withstand voltage of the semiconductor device decreases when the electric field concentrates on the pn junctions.

In contrast, in the semiconductor device illustrated in FIG. 1, the electric field relaxation regions 23 are arranged between the drift region 21 and the column regions 22, whereby the electric field concentration is relaxed. An effect of relaxing the electric field concentration by the electric field relaxation regions 23 will be described below by using models individually illustrated in FIG. 2 and FIG. 3.

Figure 2:
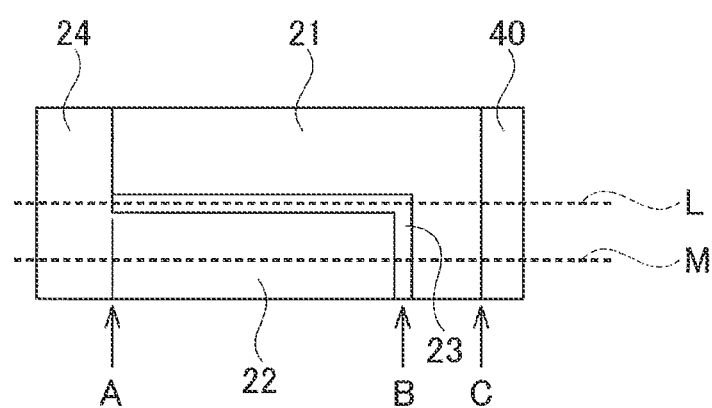
FIG. 2 is a plan view illustrating an example model for calculating an electric field intensity.
Figure 3:
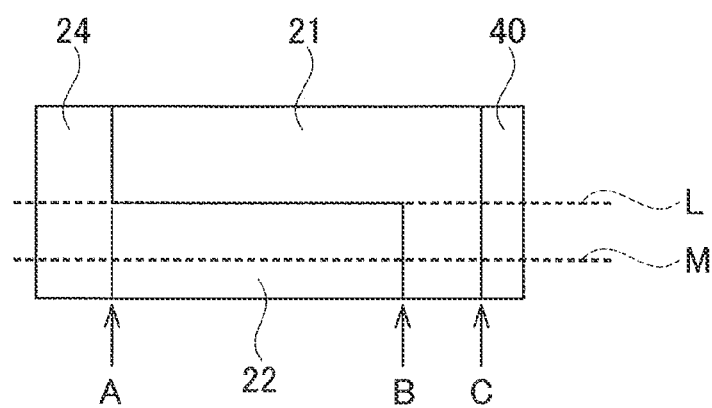
FIG. 3 is a plan view illustrating a comparative example model for calculating the electric field intensity.

The model illustrated in FIG. 2 is an example model in which the electric field relaxation region 23 is disposed between the drift region 21 and the column region 22 as in the semiconductor device illustrated in FIG. 1. Meanwhile, the model illustrated in FIG. 3 is a comparative example model in which the electric field relaxation region 23 is not disposed between the drift region 21 and the column region 22. Note that the electric field relaxation region 23 is a non-doped region.

Figure 4:
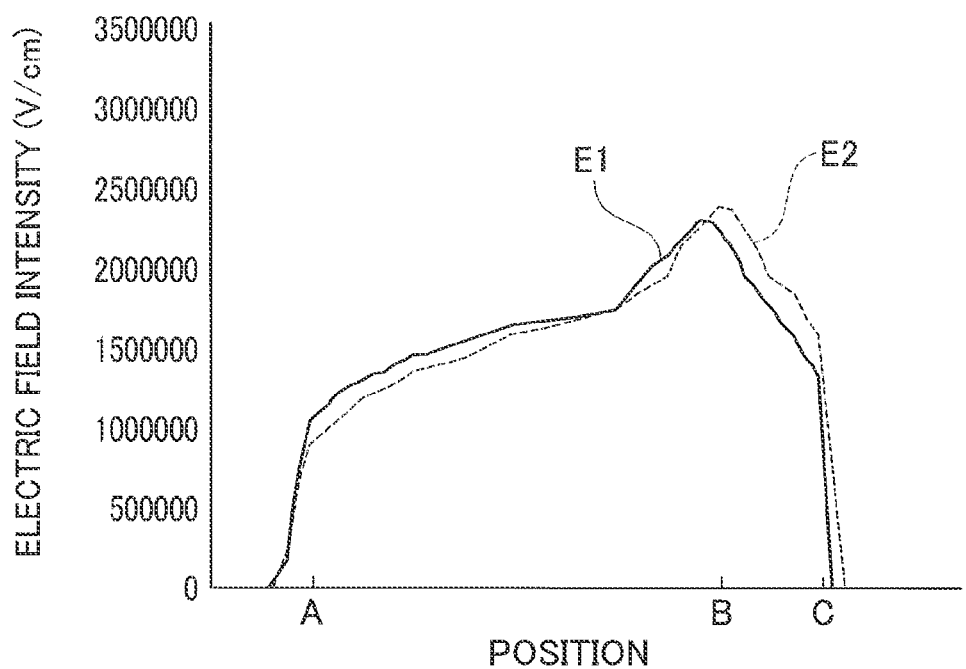
FIG. 4 is a graph illustrating a result of calculating the electric field intensity.
Figure 5:
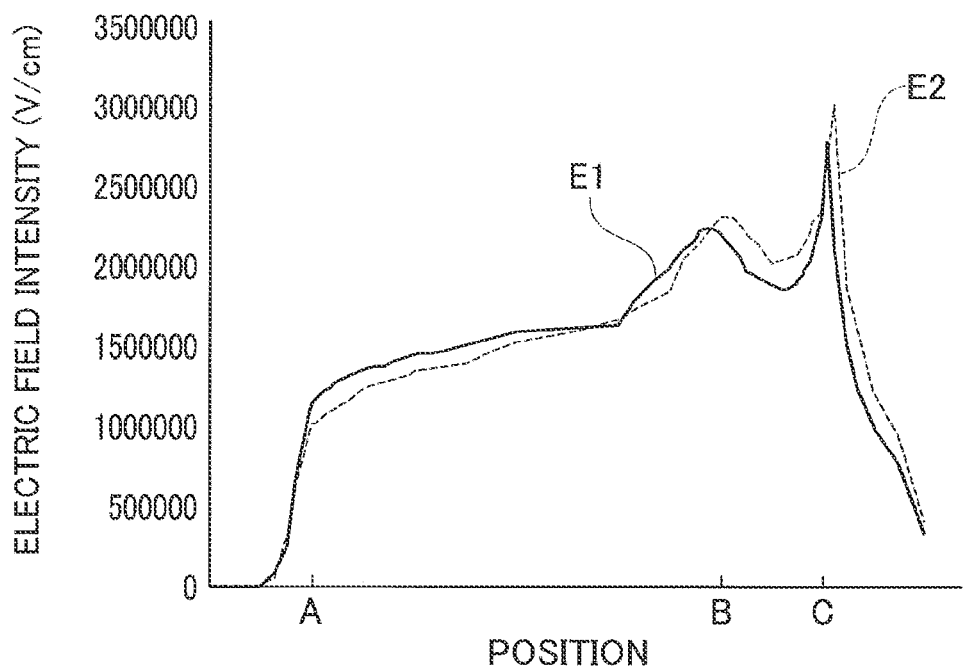
FIG. 5 is a graph illustrating a result of calculating the electric field intensity.

FIG. 4 and FIG. 5 illustrate calculation results of electric field intensities along centerlines M which pass through around the crosswise centers of the column regions 22 in the example model illustrated in FIG. 2 and the comparative example model illustrated in FIG. 3. In FIG. 4 and FIG. 5, the electric field intensity of the example model is illustrated by a characteristic E1 as a solid line, and the electric field intensity of the comparative example model is illustrated by a characteristic E2 as a broken line. A position A is a position where the well region 24 and the column region 22 connect to each other, a position B is a position of a side surface of the column region 22, which faces the second main electrode 40, and a position C is a position where the drift region 21 and the second main electrode 40 connect to each other.

FIG. 4 illustrates calculation results of electric field intensities on front surfaces of the semiconductor layers 20. As illustrated in FIG. 4, the electric field intensity of the example model is lower than of the comparative example model at the position B where the electric field intensity has a peak value. That is, in comparison with the comparative example model, an electric field distribution is more uniform in the example model. As described above, the concentration of the electric field on the side surface of the column region 22, which faces the second main electrode 40, is relaxed by the electric field relaxation region 23.

FIG. 5 illustrates calculation results of electric field intensity distributions at plane levels equivalent to bottom surfaces of the second main electrodes 40. As illustrated in FIG. 5, the electric field intensities have peak values also at the position C where the drift region 21 and the second main electrode 40 connect to each other. In the example model, the electric field intensity is lower than in the comparative example model from the position B to the position C, and the concentration of the electric field is relaxed by the electric field relaxation region 23.

As illustrated in FIG. 5, the electric field concentrates on a corner portion of the second main electrode 40 in the inside of the semiconductor layer 20. Therefore, when the electric field relaxation region 23 is formed to a depth of the bottom surface of the semiconductor layer 20, the electric field is diffused along a depth direction, and the concentration of the electric field can be relaxed. Hence, the electric field relaxation region 23 may be formed so as to reach the main surface of the substrate 10.

As described above, the electric field is concentrated on the region between each column region 22 and the second main electrode 40. Therefore, though the electric field relaxation region 23 is disposed on the entire region of the boundary between the drift region 21 and the column region 22 in the semiconductor device illustrated in FIG. 1, the electric field relaxation region 23 may be disposed in contact with only the side surface of the column region 22, which faces the second main electrode 40. The electric field relaxation region 23 is not disposed on side surfaces of the column region 22, which face the drift region 21 in parallel to the current path, whereby the width of the drift region 21 is not narrowed, and an increase of an electrical resistance in the current path of the main current can be suppressed.

Figure 6:
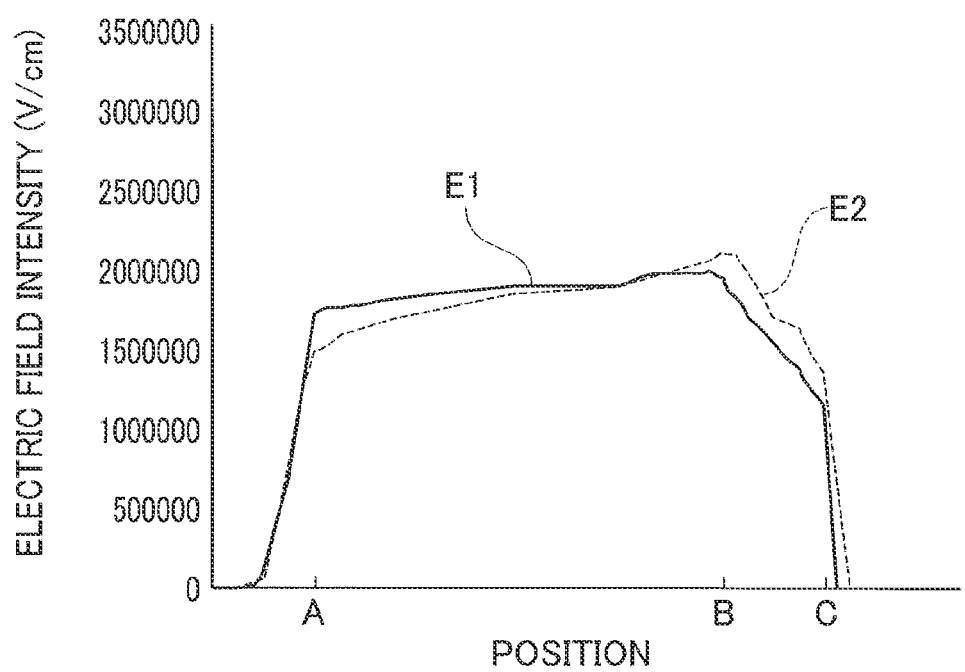
FIG. 6 is a graph illustrating a result of calculating the electric field intensity.
Figure 7:
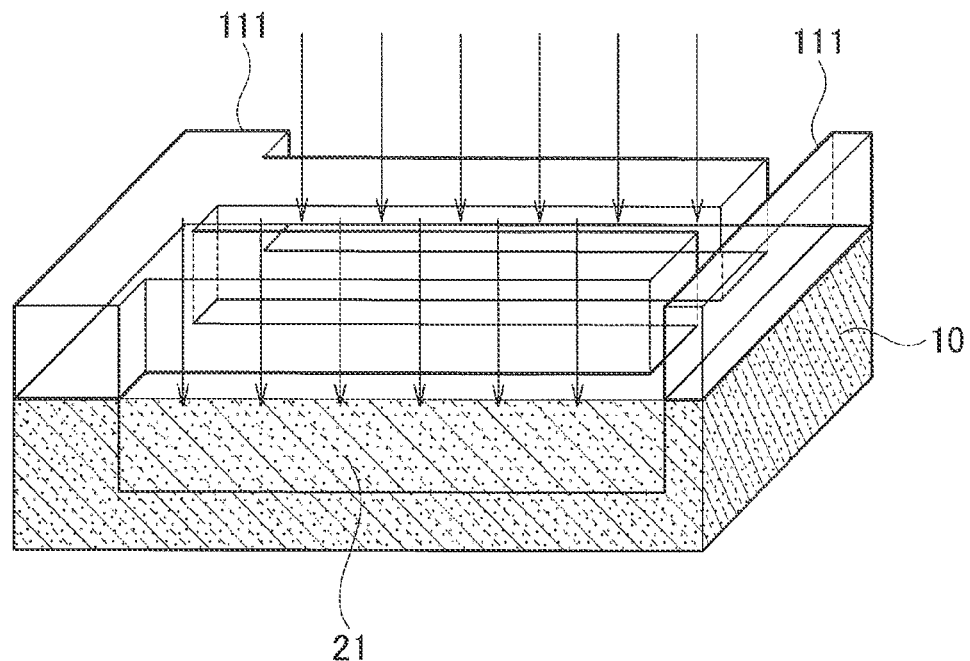
FIG. 7 is a perspective view for explaining a method for manufacturing the semiconductor device according to the first embodiment of the present invention (No. 1).

However, the concentration of the electric field also occurs in the boundary region where the drift region 21 and the column region 22 face each other, the boundary region being parallel to the current path. FIG. 6 illustrates electric field intensity distributions along boundary lines L illustrated in FIG. 2 and FIG. 3. As illustrated in FIG. 6, an electric field intensity distribution of the example model is more uniform in comparison with the comparative example model in which the electric field intensity has a peak value at the position B. As described above, the concentration of the electric field is relaxed by the electric field relaxation region 23 also in the boundary region between the drift region 21 and the column region 22, the boundary region being parallel to the current path. Therefore, as illustrated in FIG. 1, each electric field relaxation region 23 may be disposed on the side surface of the column region 22, which faces the drift region 21 in parallel to the current path.

As described above, in accordance with the semiconductor device according to the first embodiment of the present invention, the electric field relaxation region 23 is disposed on at least a part between the drift region 21 and the column region 22, whereby the concentration of the electric field is relaxed. As a result, the decrease of the withstand voltage of the semiconductor device having the SJ structure can be decreased.

For the substrate 10, a semi-insulating substrate and an insulating substrate are suitably used. Thus, an element separation process at the time of integrating a plurality of semiconductor devices on the same substrate 10 can be simplified. Moreover, at the time of mounting the semiconductor device on a cooler, it is possible to omit an insulating substrate placed between the substrate 10 and the cooler. Here, the insulating substrate refers to a substrate with resistivity of several kΩ·cm or more.

For example, a silicon carbide (SiC) substrate having insulating properties is used for the substrate 10. SiC has some polytypes (crystal polymorphisms), and an SiC substrate with typical 4H can be used for the substrate 10. The SiC substrate is used for the substrate 10, whereby the insulating properties of the substrate 10 can be increased, and thermal conductivity thereof can be increased. Therefore, the back surface of the substrate 10 can be directly attached to a cooling mechanism, and the semiconductor device can be cooled efficiently. In accordance with this structure, since thermal conductivity of the SiC substrate is large, heat generated by the main current can be radiated efficiently when the semiconductor device is in the on-state. Moreover, SiC is a wide band gap semiconductor in which the number of intrinsic carriers is small, and accordingly, easily achieves high insulating properties. Therefore, use of the SiC substrate makes it possible to achieve a semiconductor device with a high withstand voltage.

Hereinafter, a method for manufacturing the semiconductor device according to the first embodiment of the present invention will be described with reference to the drawings. Note that the method for manufacturing a semiconductor device, which will be mentioned below, is merely an example, and the semiconductor device is achievable by a variety of manufacturing methods other than this mentioned method, the manufacturing methods including modified examples thereof. Hereinafter, a description will be given of the case of using a non-doped SiC substrate for the substrate 10.

First, as illustrated in FIG. 1, the substrate 10 is doped with the n-type impurities by ion implantation using a patterned mask material 111 as a mask, and the drift region 21 is selectively forced. In order to make the structure easy to understand, only an outer edge of the mask material is illustrated (the same applies below).

As a general mask material, a silicon oxide film can be used, and as a deposition method, a thermal CVD method or a plasma CVD method can be used. As a patterning method, a photolithography method can be used. That is, the mask material is etched by using a patterned photoresist film as a mask. As an etching method, wet etching using hydrofluoric acid and dry etching such as reactive ion etching can be used. Thereafter, the photoresist film is removed by oxygen plasma, sulfuric acid or the like. In this way, the mask material is patterned.

Figure 8:
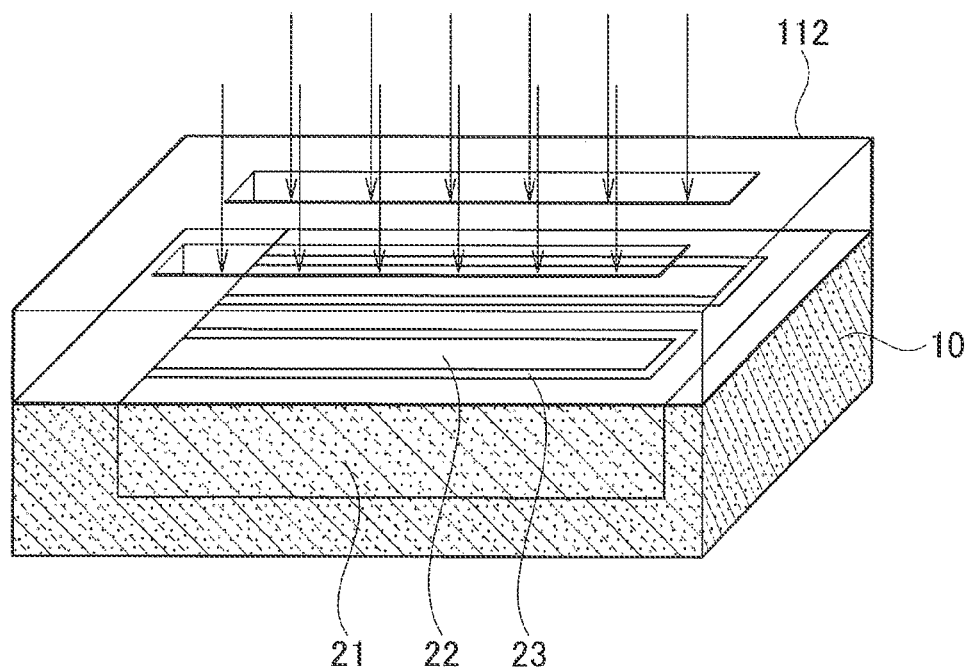
FIG. 8 is a perspective view for explaining the method for manufacturing the semiconductor device according to the first embodiment of the present invention (No. 2).

Next, the column regions 22 which extend in parallel to the drift region 21 are formed inside the drift region 21 so as to form the electric field relaxation regions 23 in at least a part between the drift region 21 and the column regions 22 themselves. That is, as illustrated in FIG. 8, the substrate 10 is doped with the p-type impurities by ion implantation using a patterned new mask material 112 as a mask, and the column regions 22 are selectively formed. The mask material 112 is designed so that, at this time, an exposed region of the substrate 10 is narrower than a region thereof in which the drift region 21 is not formed. Thus, the non-doped electric field relaxation regions 23 are formed between the drift region 21 and the column regions 22.

Figure 9:
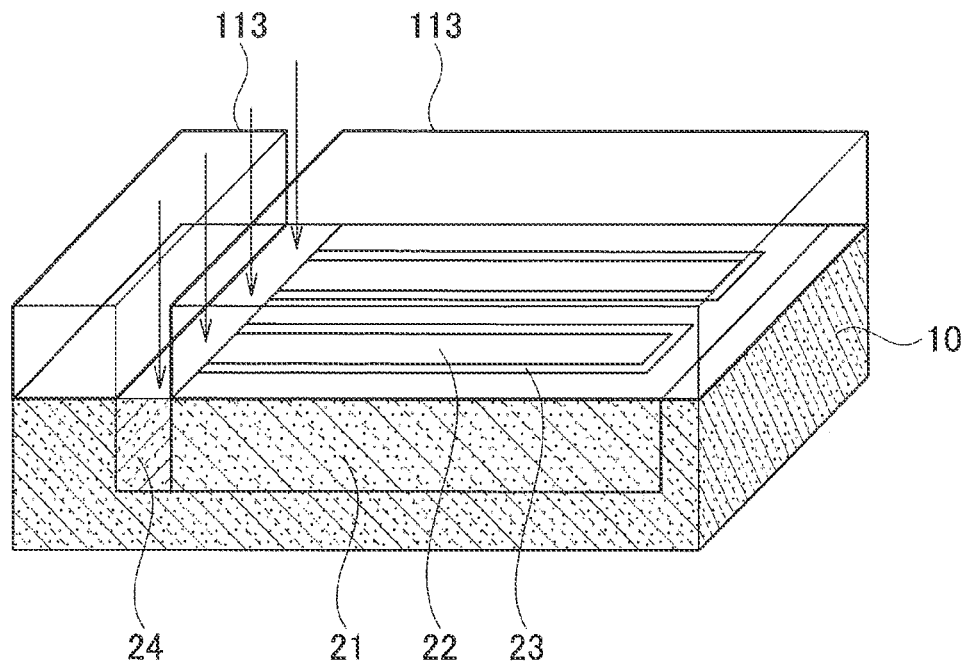
FIG. 9 is a perspective view for explaining the method for manufacturing the semiconductor device according to the first embodiment of the present invention (No. 3).
Figure 10:
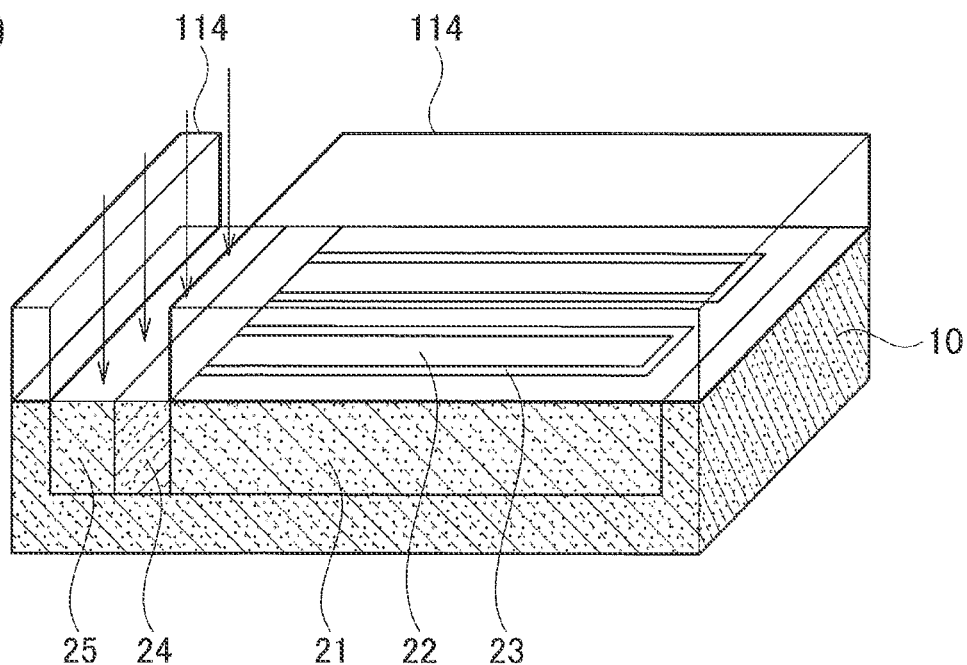
FIG. 10 is a perspective view for explaining the method for manufacturing the semiconductor device according to the first embodiment of the present invention (No. 4).

Thereafter, as illustrated in FIG. 9, the well region 24 is formed by ion implantation of doping the substrate 10 with the p-type impurities by using a mask material 113 as a mask. Moreover, as illustrated in FIG. 10, the source region 25 is formed by ion implantation of doping the substrate 10 with the n-type impurities by using a mask material 114 as a mask.

In the ion implantation, for example, nitrogen (N) is used as the n-type impurities, and aluminum and boron are used as the p-type impurities. Note that a crystal defect can be suppressed from occurring in ion-implanted regions by performing the ion implantation in a state of heating the substrate 10 to a temperature of approximately 600° C. Then, the ion-implanted impurities are activated by being subjected to heat treatment. For example, heat treatment at approximately 1700° C. is performed in an argon atmosphere or a nitrogen atmosphere.

The impurity concentrations of the column regions 22 and the drift region 21 are, for example, approximately $1E15/cm^3$ to $1E19/cm^3$. However, the impurity concentrations of the drift region 21 and the column regions 22 are set so as to satisfy the relationship of Equation (1) so that the drift region 21 and the column regions 22 are depleted by the depletion layers generated between the drift region 21 and the column regions 22 in an off-state.

An impurity concentration of the well region 24 is, for example, approximately $1E15/cm^3$ to $1E19/cm^3$. Moreover, an impurity concentration of the source region 25 is, for example, approximately $1E18/cm^3$ to $1E21/cm^3$.

Note that manufacturing cost can be reduced in the case of ion-implanting impurities into the substrate 10 to form the drift region 21 end the column regions 22 more than in the case forming the drift region 21 and the column regions 22 by epitaxial growth.

Figure 11:
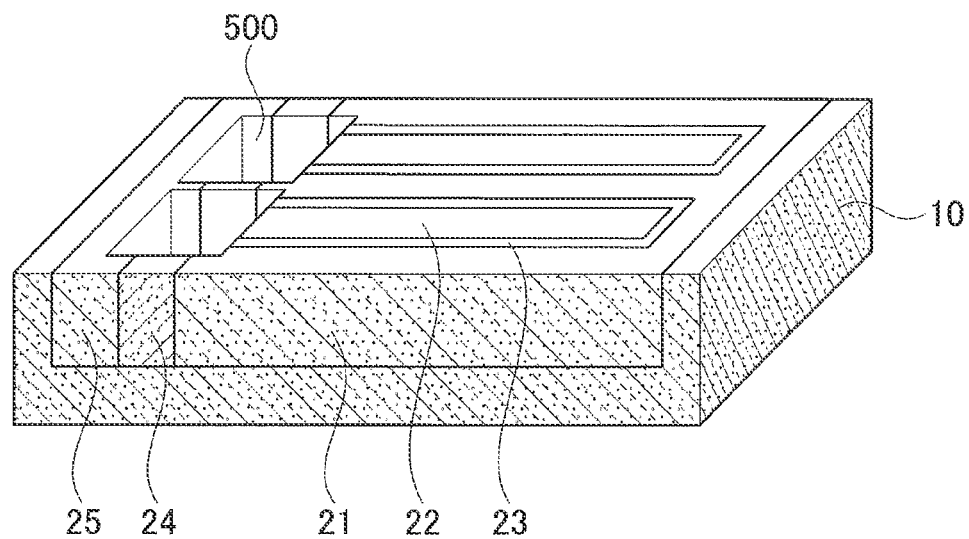
FIG. 11 is a perspective view for explaining the method tor manufacturing the semiconductor device according to the first embodiment of the present invention (No. 5).

Next, as illustrated in FIG. 11, gate trenches 500 are formed by dry etching using a patterned mask material (not shown) as a mask. To a depth reaching the substrate 10, the gate trenches 500 are formed at positions in contact with the source region 25, the well region 24, the drift region 21 and the column regions 22.

Thereafter, the gate insulating films 60 are formed on inner wall surfaces of the gate trenches 500. A method for forming the gate insulating films 60 may by either a thermal oxidation method or a deposition method. As an example, in the case of the thermal oxidation method, the substrate is heated to a temperature of approximately 1100° C. in an oxygen atmosphere. Thus, a silicon oxide film is formed on all portions where the substrate contacts oxygen.

After the gate insulating films 60 are formed, annealing treatment at approximately 1000° C. may be performed in an atmosphere of nitrogen, argon, $N_2O$ or the like in order to reduce an interface state on interfaces between the well region 24 and the gate insulating films 60. Moreover, thermal oxidation in an atmosphere of rigid NO or $H_2O$ is also possible. A temperature in that case is suitably 1100° C. to 1400° C. A thickness of the gate insulating films 60 is about several ten nanometers.

Next, the gate trenches 500 are embedded to form the control electrodes 50. A general material of the control electrodes 50 is polysilicon films, and a description will be given here of the case of using the polysilicon films for the control electrodes 50.

A reduced pressure CVD method or the like can be used as the deposition method of the polysilicon films. For example, a thickness of the polysilicon films to be deposited is set to a value larger than a half of a width of each of the gate trenches 500, and the gate trenches 500 are embedded with the polysilicon films. Since the polysilicon films are formed from the inner wall surfaces of the gate trenches 500, the gate trenches 500 can be completely embedded with the polysilicon films by setting the thickness of the polysilicon films as described above. For example, when the width of the gate trenches 500 is 2 µm, the polysilicon films are formed so that a film thickness thereof becomes thicker than 1 µm. Moreover, after the polysilicon films are deposited, annealing treatment at 950° C. is performed in phosphorus oxychloride ($POCl_3$), whereby n-type polysilicon films are formed to impart conductivity to the control electrodes 50.

Figure 12:
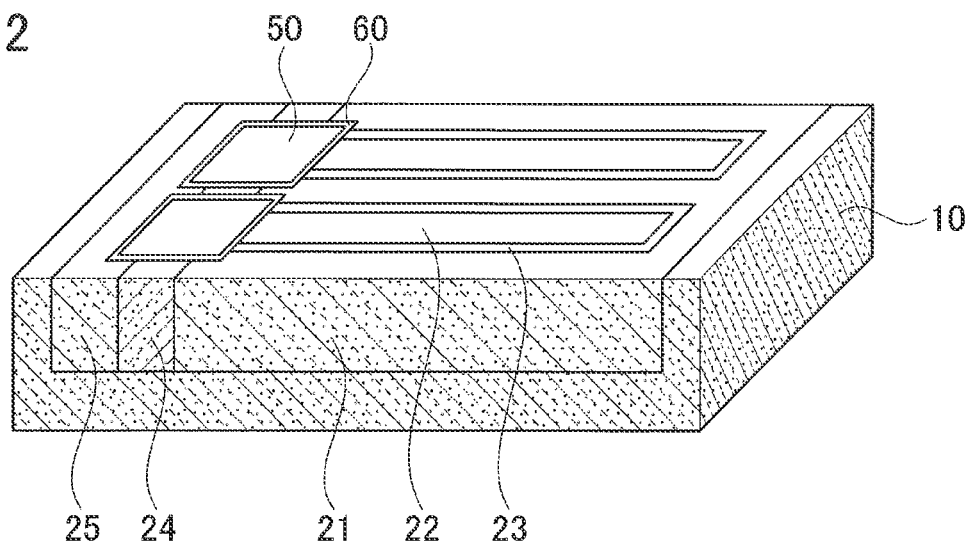
FIG. 12 is a perspective view for explaining the method for manufacturing the semiconductor device according to the first embodiment of the present invention (No. 6).

Next, as illustrated in FIG. 12, the polysilicon films are etched to be planarized. A method of the etching may be isotropic etching or anisotropic selective etching. An amount of the etching is set so that the polysilicon films remain inside the gate trenches 500. For example, when the polysilicon films are deposited to a thickness of 1.5 µm for the gate trenches 500 with a width of 2 µm, the amount of etching the polysilicon films is set to 1.5 µm. However, in control for the etching, no problem occurs in the case of over etching of several percent with respect to the amount of etching of 1.5 µm.

Thereafter, the first main electrode 30 and the second main electrode 40, which face each other with the semiconductor layer 20 sandwiched therebetween, are formed separately from each other on the substrate 10 along a direction where the drift region 21 extends. For example, the first main electrode 30 and the second main electrode 40 are formed on predetermined regions formed by selectively etching the substrate 10 by using an etching mask patterned by a photolithography technology and the like. Thus, the semiconductor device illustrated in FIG. 1 is completed.

As a material of the first main electrode 30 and the second main electrode 40, there can be used metal materials such as titanium (Ti), nickel (Ni) and molybdenum (Mo) and laminated films of Ti/Ni/Ag and the like. For example, after such a metal material is entirely deposited by a sputtering method, an EB evaporation method or the like, the metal material is etched by dry etching using a patterned photoresist film as a mask, and each of the first main electrode 30 and the second main electrode 40 is formed. Alternatively, the first main electrode 30 and the second main electrode 40 may be formed by a plating process.

In accordance with the method for manufacturing a semiconductor device, which is described above, the electric field relaxation regions 23 are formed between the drift region 21 and the column regions 22. Therefore, the concentration of the electric field at the time of reverse bias is relaxed, and the decrease of the withstand voltage of the semiconductor device having the SJ structure can be suppressed.

Note that, in the above, the description is given of the case of forming the electric field relaxation regions 23 as non-doped semiconductor regions by leaving a part of the non-doped substrate 10 between the drift region 21 and the column regions 22. However, the electric field relaxation regions 23 are not limited to the non-doped regions. That is, the electric field relaxation regions 23 may be either n-type semiconductor regions formed by doping the substrate 10 with n-type impurities or p-type semiconductor regions formed by doping the substrate 10 with p-type impurities.

For example, when the drift region 21 is an n-type semiconductor region, and the column regions 22 are p-type semiconductor regions, then the electric field relaxation regions 23 may be set to be n-type semiconductor regions having a lower impurity concentration than the drift region 21. Alternatively, the electric field relaxation regions 23 may be set to be p-type semiconductor regions having a lower impurity concentration than the column regions 22.

In the above, the description is given of the example of using an SiC substrate for the substrate 10; however, a semi-insulating substrate or an insulating substrate other than the SiC substrate may be used for the substrate 10. For example, a GaN substrate, a diamond substrate, a zinc oxide (ZnO) substrate, an AlGaN substrate and the like, which are wide band gap substrates, may be used for the substrate 10.

Moreover, a wide band gap semiconductor may be used for the semiconductor layer 20. Thus, it is possible to increase the impurity concentration while keeping on maintaining the withstand voltage to be high. Therefore, the withstand voltage of the semiconductor device can be increased, and the on-resistance can be reduced.

Further, the semiconductor layer 20 in which the respective regions are made of the same material is used, whereby active regions of the semiconductor device are formed of the same semiconductor material. Thus, a malfunction caused by an occurrence of a defect due to junction of different types of semiconductor materials can be eliminated, and reliability of the semiconductor device can be improved.

Note that, in the above, the description is given of the example of using the first conductivity-type polysilicon films for the control electrodes 50; however, second conductivity-type polysilicon films may be used for the control electrodes 50. Moreover, other semiconductor materials may be used for the control electrodes 50, or other conductive materials such as metal materials may be used. For example, second conductivity-type poly silicon carbide, SiGe, Al and the like can be used for the materials of the control electrodes 50.

Further, though the example of using the silicon oxide films for the gate insulating films 60 is described, silicon nitride films may be used for the gate insulating films 60.

Moreover, laminated films of the silicon oxide films and the silicon nitride films may be used for the gate insulating films 60. Isotropic etching in the case of using the silicon nitride films for the gate insulating films 60 can be performed by washing using hot phosphoric acid at 160° C.

Modified Example

A semiconductor device according to a modified example of the first embodiment of the present invention further includes an electric field relaxation electrode disposed so as to cover at least a part of the region where the drift region 21 and the column regions 22 face each other. In the semiconductor device according to the modified example, which is illustrated in FIG. 12, an electric field relaxation electrode 70 is disposed above the side surfaces of the column regions 22, which face the second main electrode 40. That is, the electric field relaxation electrode 70 is disposed on an upper surface of an interlayer insulating film 80 disposed on an upper surface of the semiconductor layer 20, and the electric field relaxation electrode 70 electrically connects to the second main electrode 40 through an opening portion provided in the interlayer insulating film 80.

A conductor film such as a metal film is used for the electric field relaxation electrode 70. The electric field relaxation electrode 70 and the second main electrode 40 may be formed integrally with each other, for example, by using the same material as the second main electrode 40. For example, an insulating film such as a silicon oxide film is used for the interlayer insulating film 80.

Figure 13:
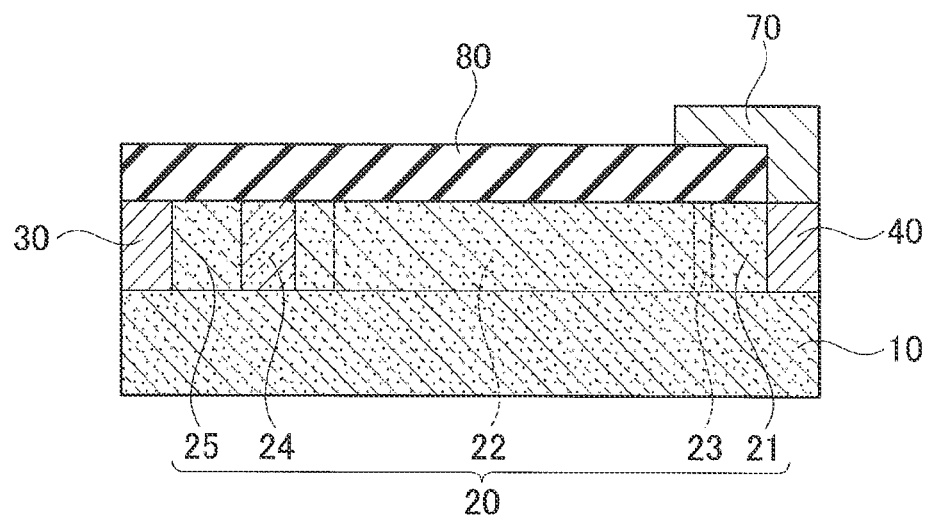
FIG. 13 is a schematic cross-sectional view illustrating a configuration of a semiconductor device according to a modified example of the first embodiment of the present invention.

In the semiconductor device illustrated in FIG. 13, the electric field relaxation electrode 70 is disposed above the boundary region between the drift region 21 and the column regions 22, on which an electric field is likely to concentrate, whereby a gradient of a potential distribution in the boundary region becomes gentle, and the concentration of the electric field can be relaxed. That is, the electric field relaxation electrode 70 is disposed above the boundary region, whereby the depletion layer smoothly extends in the boundary region. A curvature of the depletion layer is controlled as described above, whereby the potential changes gently, and the concentration of the electric field is relaxed. At this time, the electric field relaxation electrode 70 of which potential is the same as that of the second main electrode 40 is disposed above the boundary region close to the second main electrode 40, whereby the concentration of the electric field in the boundary region can be relaxed greatly.

Note that, though FIG. 13 illustrates the example where the electric field relaxation electrode 70 is disposed above the side surfaces of the column regions 22, which face the second main electrode 40, the electric field relaxation electrode 70 may be disposed above side surfaces of the column regions 22, which are adjacent to the drift region 21 in parallel to the current path. That is, the electric field relaxation electrode 70 is disposed above a region on which the electric field concentrates. Moreover, though the example where the electric field relaxation electrode 70 electrically connects to the second main electrode 40, the electric field relaxation electrode 70 may electrically connect to the first main electrode 30 or the control electrodes 50.

Second Embodiment

Figure 14:
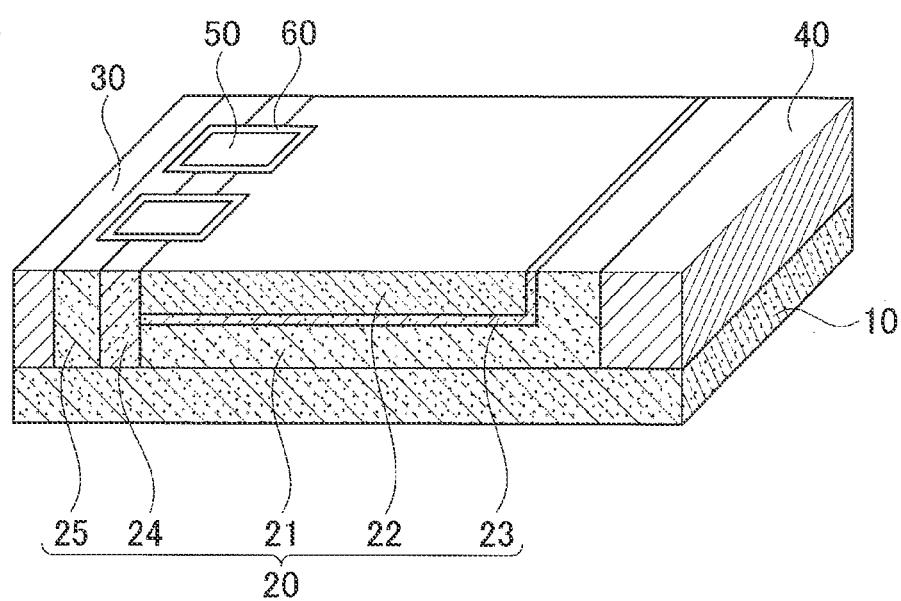
FIG. 14 is a schematic perspective view illustrating a configuration of a semiconductor device according to a second embodiment of the present invention.

In a semiconductor device according to a second embodiment of the present invention, as illustrated in FIG. 14, the drift region 21 and the column region 22 are disposed alternately with each other along a thickness direction of the substrate 10, and constitute an SJ structure. Then, the drift region 21, the electric field relaxation region 23 and the column region 22 are laminated on one another in the thickness direction. In the semiconductor device illustrated in FIG. 14, in place of the impurity concentrations and widths of the drift region 21 and the column regions 22, thicknesses thereof are set so as to satisfy Equation (1). Other configurations are the same as those of the first embodiment illustrated in FIG. 1.

Hereinafter, a method for manufacturing the semiconductor device according to the second embodiment of the present invention will be described with reference to the drawings. Note that the method for manufacturing a semiconductor device, which will be mentioned below, is merely an example, and the semiconductor device is achievable by a variety of manufacturing methods other than this mentioned method, the manufacturing methods including modified examples thereof.

Figure 15:
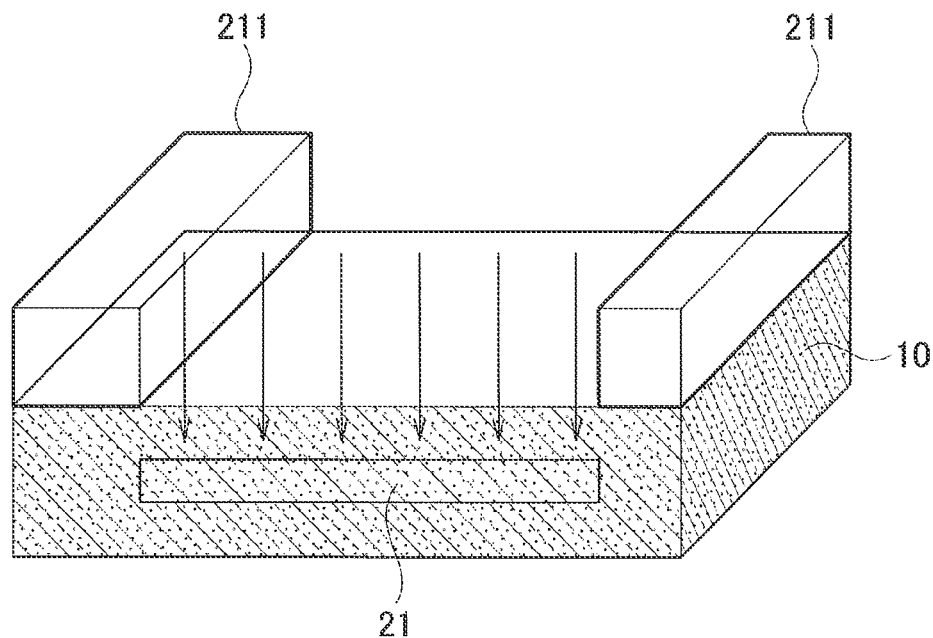
FIG. 15 is a perspective view for explaining a method for manufacturing the semiconductor device according to the second embodiment of the present invention (No. 1).

First, as illustrated in FIG. 15, the substrate 10 is doped with the n-type impurities by ion implantation using a patterned mask material 211 as a mask, and the drift region 21 is selectively formed. The substrate 10 is a non-doped SiC semiconductor. An intensity of energy of the ion implantation is adjusted, whereby the drift region 21 is formed at a position separate from the main surface of the substrate 10 by the sum of the thickness of the column region 22 and the thickness of the electric field relaxation region 23.

Figure 16:
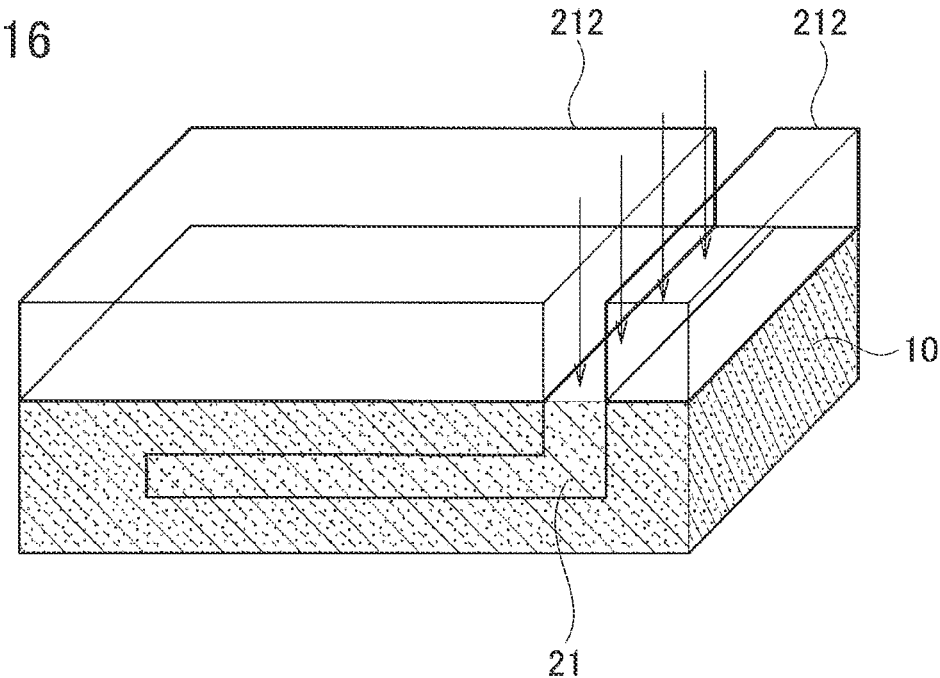
FIG. 16 is a perspective view for explaining the method for manufacturing the semiconductor device according to the second embodiment of the present invention (No. 2).

Subsequently, as illustrated in FIG. 16, an exposed portion is formed on a front surface of the drift region 21 by ion implantation using a mask material 212 as a mask. For example, the drift region 21 of a portion on which the column region 22 is not laminated, the portion connecting to the second main electrode 40, is formed.

Figure 17:
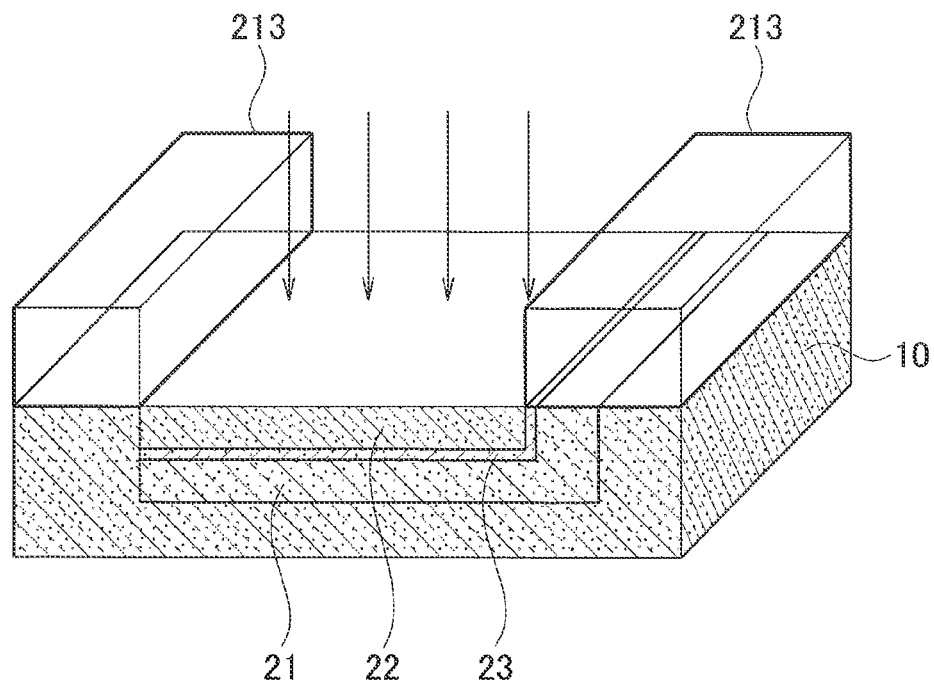
FIG. 17 is a perspective view for explaining the method for manufacturing the semiconductor device according to the second embodiment of the present invention (No. 3).

Next, as illustrated in FIG. 17, the substrate 10 is doped with the p-type impurities by ion implantation using mask materials 213 as masks, and the column region 22 is selectively formed. At this time, an intensity of energy of the ion implantation is adjusted, whereby the electric field relaxation region 23 that is not doped with impurities is formed between the drift region 21 and the column region 22.

Figure 18:
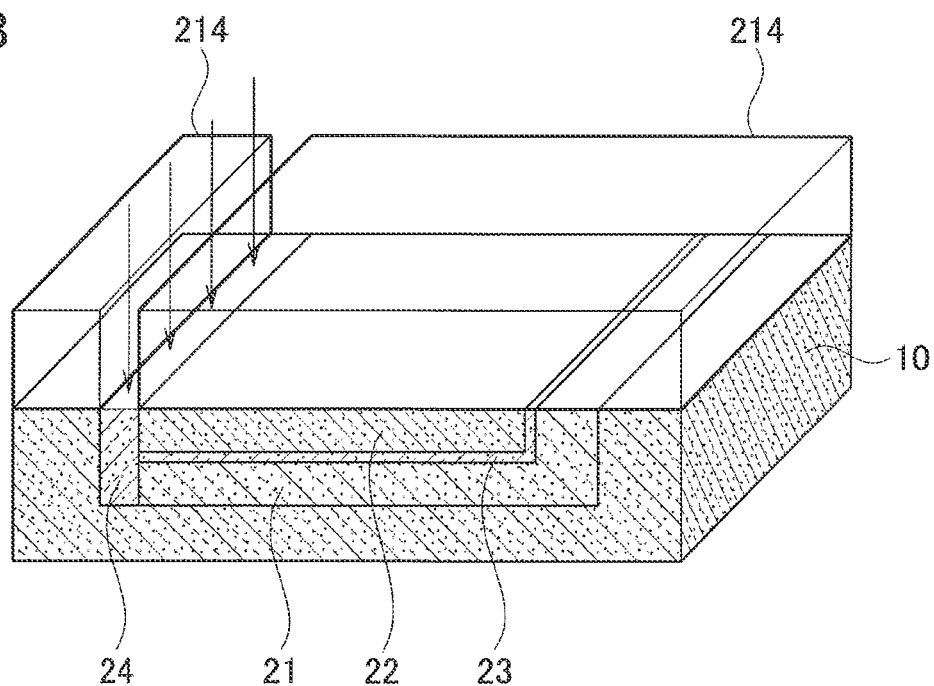
FIG. 18 is a perspective view for explaining the method for manufacturing the semiconductor device according to the second embodiment of the present invention (No. 4).
Figure 19:
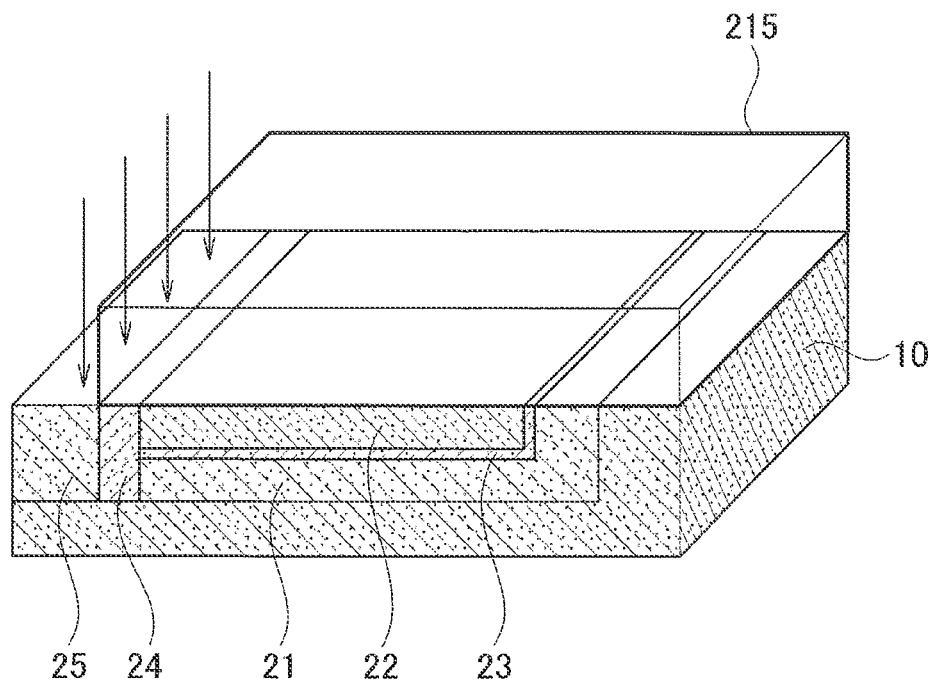
FIG. 19 is a perspective view for explaining the method for manufacturing the semiconductor device according to the second embodiment of the present invention (No. 5).

Thereafter, as illustrated in FIG. 18, the well region 24 is formed by ion implantation of doping the substrate 10 with the p-type impurities by using mask materials 214 as masks. Moreover, as illustrated in FIG. 19, the source region 25 is formed by ion implantation of doping the substrate 10 with the n-type impurities by using a mask material 215 as a mask.

Figure 20:
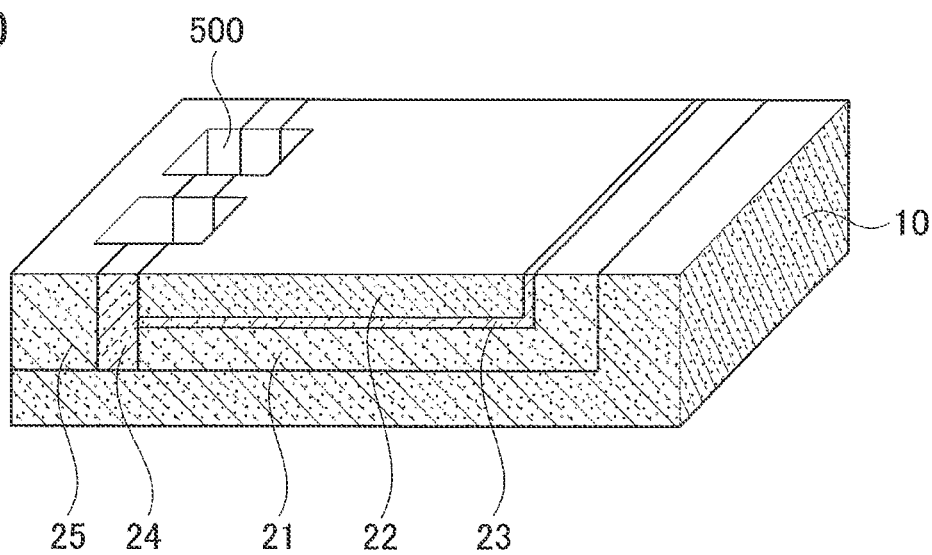
FIG. 20 is a perspective view for explaining the method for manufacturing the semiconductor device according to the second embodiment of the present invention (No. 6).

Next, as illustrated in FIG. 20, the gate trenches 500 are formed by dry etching using a patterned mask material (not shown) as a mask. To a depth reaching the substrate 10, the gate trenches 500 are formed at positions in contact with the source region 25, the well region 24, the drift region 21 and the column regions 22.

Figure 21:
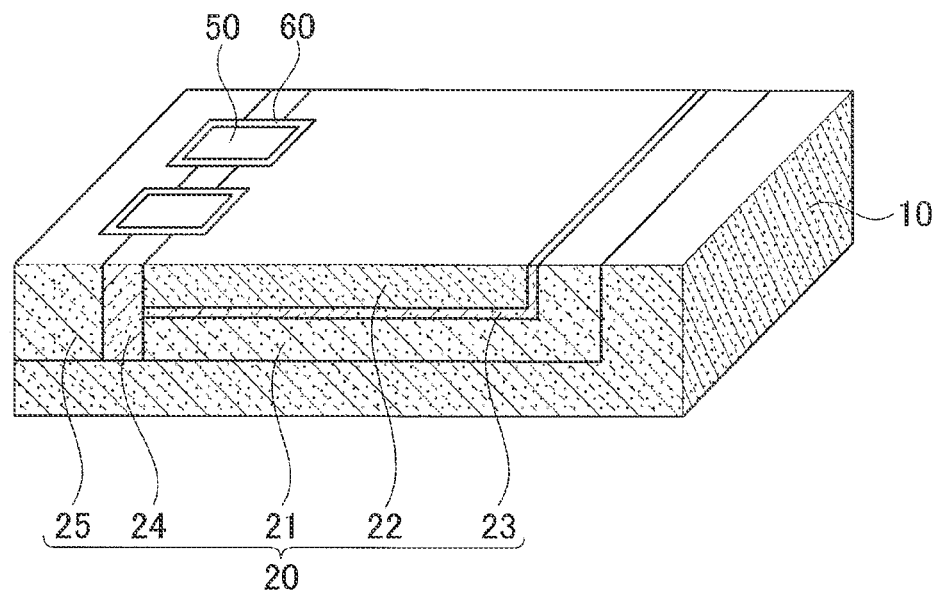
FIG. 21 is a perspective view for explaining the method for manufacturing the semiconductor device according to the second embodiment of the present invention (No. 7).

After the gate insulating films 60 are formed on the inner wall surfaces of the gate trenches 500, as illustrated in FIG. 21, the gate trenches 500 are embedded to form the control electrodes 50. A method for forming the gate insulating films 60 and the control electrodes 50 is the same as the method described in the first embodiment.

Thereafter, the first main electrode 30 and the second main electrode 40, which face each other with the semiconductor layer 20 sandwiched therebetween, are formed separately from each other on the substrate 10. In such a way as described above, the semiconductor device illustrated in FIG. 14 is completed.

In the semiconductor device illustrated in FIG. 1, the widths of the drift region 21 and the column regions 22 in the horizontal direction parallel to the main surface of the substrate 10 depend on accuracy of the photolithography technology or the like, and for example, are about 1 µm to several ten micrometers. Meanwhile, in the semiconductor device illustrated in FIG. 14, the thicknesses of the drift region 21 and the column regions 22 can be accurately controlled by adjusting the intensities of the energy of the ion implantation of impurity doping. Therefore, the thickness of the drift region 21 and the thickness of the column region 22 can be thinned more than the widths thereof in the horizontal direction, for example, can be set to about several ten nanometers to several hundred nanometers. Hence, a repetition period of the drift region 21 and the column region 22, which constitute the SJ structure, can be shortened. Therefore, in the semiconductor device illustrated in FIG. 14, it is easy to establish the pinch-off state.

In FIG. 14, the drift region 21 and the column region 22 are each a single layer; however, a plurality of the drift regions 21 and a plurality of the column regions 22 may be laminated alternately on each other. Thus, an SJ structure is configured, in which a plurality of pn junctions are arrayed in a fixed period in the thickness direction of the substrate 10. With this configuration, the withstand voltage of the semiconductor device can be further enhanced.

As described above, in accordance with the semiconductor device according to the second embodiment of the present invention, a decrease of the withstand voltage of the semiconductor device can be reduced, the semiconductor device having the SJ structure in which the drift regions 21 and the column regions 22 are arranged alternately with each other along the thickness direction of the substrate 10. Others are substantially similar to those of the first embodiment, and a duplicate description will be omitted.

Third Embodiment

Figure 22:
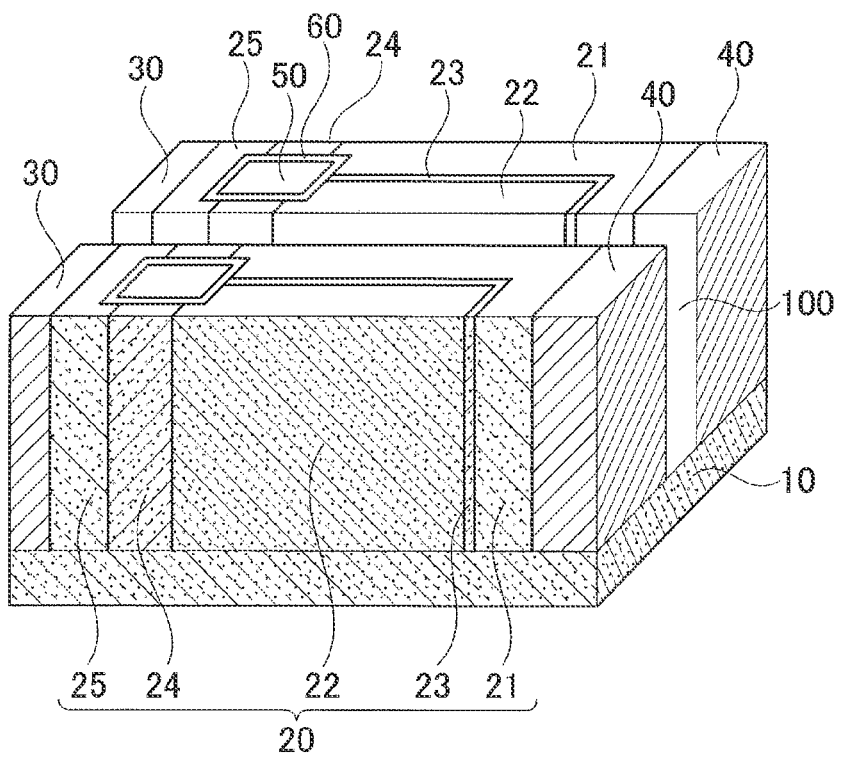
FIG. 22 is a schematic perspective view illustrating a configuration of a semiconductor device according to a third embodiment of the present invention.

In a semiconductor device according to a third embodiment of the present invention, as illustrated in FIG. 22, such semiconductor layers 20 are formed on side surfaces of a groove 100 formed on the main surface of the substrate 10. In the semiconductor device illustrated in FIG. 22, in place of the impurity concentrations and widths of the drift region 21 and the column regions 22, a thickness in a surface normal direction of the side surfaces of the groove (hereinafter, this direction will be referred to as a "surface normal direction") is set so as to satisfy Equation (1). Thus, in the semiconductor device illustrated in FIG. 22, SJ structures are configured on the side surfaces of the groove of the substrate 10 along the surface normal direction.

Also in the semiconductor device illustrated in FIG. 22, the electric field relaxation regions 23 are disposed in contact with the side surfaces of the column regions 22, which face the second main electrodes 40. Moreover, the electric field relaxation regions 23 disposed in contact with the side surfaces of the column regions 22 which face the drift regions 21 in parallel to the current path are disposed between the drift regions 21 and the column regions 22 along the surface normal direction. Therefore, the decrease of the withstand voltage of the semiconductor device can be reduced.

Moreover, in accordance with the semiconductor device illustrated in FIG. 22, the drift regions 21 and the column regions 22 are formed on the side surfaces of the groove 100, whereby the width of the current path can be widened in a depth direction of the substrate 10. Therefore, the on-resistance per substrate area decreases. The semiconductor layers 20 are formed by ion-implanting the impurities from obliquely above to the groove 100 formed on the main surface of the substrate 10 by etching.

Fourth Embodiment

Figure 23:
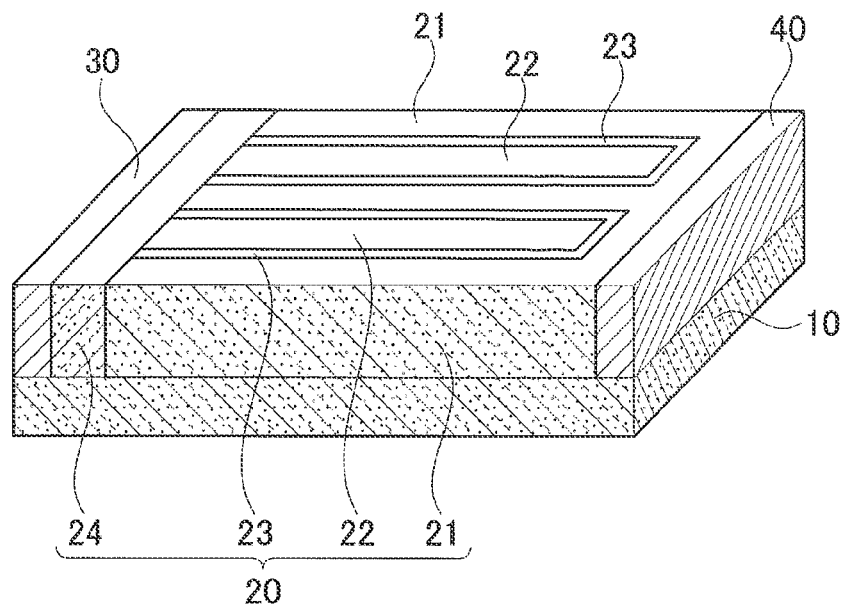
FIG. 23 is a schematic perspective view illustrating a configuration of a semiconductor device according to a fourth embodiment of the present invention.

As illustrated in FIG. 23, a semiconductor device according to a fourth embodiment of the present invention has a diode structure in which the well region 24 connects to the first main electrode 30. That is, the semiconductor device illustrated in FIG. 23 operates as a pn junction diode in which the first main electrode 30 is anode electrode and the second main electrode 40 is a cathode electrode. Also in the semiconductor device illustrated in FIG. 23, the drift region 21 and the column regions 22 are arranged alternately with each other along the direction perpendicular to the current path, whereby an SJ structure is configured. End portions of the drift region 21 and the column regions 22 connect to the well region 24, and other end portion of the drift region 21 connects to the second main electrode 40.

In an on-operation, a low voltage (forward voltage) is applied to the second main electrode 40 while the first main electrode 30 is being set to a reference potential, whereby an energy barrier between the well region 24 and the drift region 21 lowers. Therefore, electrons come to flow from the drift region 21 to the well region 24, and a forward current flows between the first main electrode 30 and the second main electrode 40. In an off-operation, a high voltage (reverse voltage) is applied to the second main electrode 40 while the first main electrode 30 is being set to the reference potential, whereby the energy barrier between the well region 24 and the drift region 21 rises. Therefore, the electrons come not to flow from the drift region 21 to the well region 24.

Also in the semiconductor device having such a diode structure illustrated in FIG. 23, the concentration of the electric field is relaxed by the electric field relaxation regions 23 disposed between the drift region 21 and the column regions 22, and the withstand voltage improves. Note that a leakage current at an off-time can be suppressed in the pn junction diode in which the well region 24 is disposed between the first main electrode 30 and the drift region 21 and the column regions 22.

Figure 24:
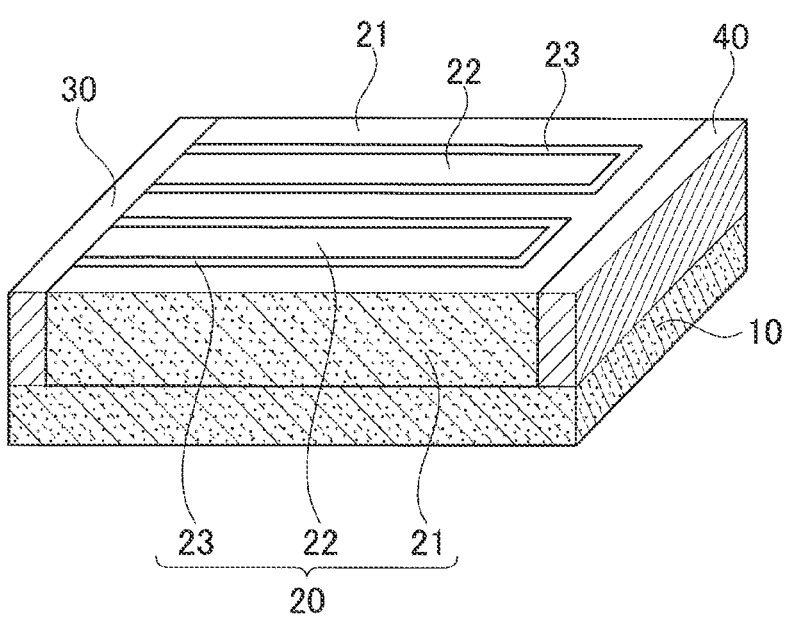
FIG. 24 is a schematic perspective view illustrating another configuration of the semiconductor device according to the fourth embodiment of the present invention.

Moreover, as illustrated in FIG. 24, the semiconductor device according to the embodiment may be a Schottky barrier diode (SBD) in which the drift region 21 and the first main electrode 30 connect to each other. In the semiconductor device illustrated in FIG. 24, the well region 24 is not disposed between the drift region 21 and the first main electrode 30, and the drift region 21 and the first main electrode 30 electrically connect to each other while having an energy barrier on an interface therebetween. Meanwhile, the second main electrode 40 makes an ohmic connection to the drift region 21.

In the semiconductor device illustrated in FIG. 24, a metal material such as nickel and platinum, which has a high work function, is used for the first main electrode 30, whereby a Schottky junction is formed between the drift region 21 and the first main electrode 30. For the second main electrode 40, a material such as titanium, which has a low work function and makes an ohmic connection to the drift region 21, is used. Also in the SBD illustrated in FIG. 24, the electric field relaxation regions 23 are disposed between the drift region 21 and the column regions 22, whereby the concentration of the electric field can be relaxed.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

For example, in the above, the description is given of the case where the semiconductor device that operates as a transistor is a MOSFET. However, the semiconductor device may be a transistor with another structure. For example, the present invention is also applicable to a bipolar transistor in which the first main electrode 30 is an emitter electrode, the second main electrode 40 is a collector electrode, and the control electrode 50 is a base electrode.

As described above, it is natural that the present invention incorporates a variety of embodiments which are not described herein.

INDUSTRIAL APPLICABILITY

The semiconductor device of the present invention and the method for manufacturing the semiconductor device are usable for an electronic device industry including manufacturers which manufacture the semiconductor device having the SJ structure.

REFERENCE SIGNS LIST

10 Substrate
20 Semiconductor layer
21 Drift region
22 Column region
23 Electric field relaxation region
24 Well region
25 Source region
30 First main electrode
40 Second main electrode
50 Control electrode
60 Gate insulating film
70 Electric field relaxation electrode

The invention claimed is:

1. A semiconductor device comprising:
a substrate;
a semiconductor layer disposed on a main surface of the substrate; and
a first main electrode and a second main electrode, which are disposed on the substrate separately from each other with the semiconductor layer sandwiched therebetween and are individually end portions of a current path of a main current flowing in an on-state,
wherein the semiconductor layer includes:
a first conductivity-type drift region through which the main current flows;
a second conductivity-type column region that is disposed inside the drift region and extends in parallel to the current path; and
an electric field relaxation region that is disposed in at least a part between the drift region and the column region and is either a low-concentration region in which an impurity concentration is lower than in a same conductivity-type adjacent region or a non-doped region, the electric field relaxation region being at least disposed on a side surface of the column region facing the second main electrode via the drift region, and
wherein the respective regions of the semiconductor layer are formed of a same material.

2. The semiconductor device according to claim 1, wherein the electric field relaxation region is disposed on a side surface of the column region, the side surface facing the drift region in parallel to the current path.

3. The semiconductor device according to claim 1, wherein impurity concentrations of the drift region and the column region are set so that the drift region and the column region are depleted by a depletion layer generated between the drift region and the column region in an off-state in which the main current is cut off.

4. The semiconductor device according to claim 1, wherein the electric field relaxation region reaches the substrate.

5. The semiconductor device according to claim 1, wherein the semiconductor layer includes a second conductivity-type well region disposed between the drift region and the first main electrode and between the column region and the first main electrode.

6. The semiconductor device according to claim 5, wherein the semiconductor layer includes a first conductivity-type source region disposed between the well region and the first main electrode and electrically connected to the first main electrode,
wherein the semiconductor device further includes a control electrode embedded in the semiconductor layer while facing the drift region, the well region and the source region with an insulating film interposed therebetween, and
wherein the semiconductor device operates as a transistor that controls the main current by the control electrode.

7. The semiconductor device according to claim 1, further comprising an electric field relaxation electrode disposed so as to cover at least a part of a region where the drift region and the column region face each other and electrically connected to the first main electrode or the second main electrode.

8. The semiconductor device according to claim 1, wherein, on a side surface of a groove formed in the substrate, the drift region and the column region are arranged alternately with each other along a surface normal direction of the side surface of the groove.

9. The semiconductor device according to claim 1, wherein the drift region and the column region are arranged alternately with each other along a thickness direction of the substrate.

10. The semiconductor device according to claim 1, wherein the semiconductor layer is formed of a wide band gap semiconductor.

11. The semiconductor device according to claim 1, wherein the substrate is a semi-insulating substrate or an insulating substrate.

12. The semiconductor device according to claim 1, wherein the substrate is a silicon carbide substrate.

13. A method for manufacturing a semiconductor device, the method comprising:
forming a semiconductor layer comprising:
a first conductivity-type drift region on a main surface of a substrate;
a second conductivity-type column region inside the drift region, the column region extending in parallel to the drift region, and an electric field relaxation region in at least a part between the column region and the drift region, the electric field relaxation region being either a lower-concentration region in which an impurity concentration is lower than in a same conductivity-type adjacent region or a non-doped region; and forming a first main electrode and a second main electrode separately from each other on the substrate along a direction where the drift region extends, the first main electrode and the second main electrode facing each other with the drift region and the column region interposed therebetween, wherein the drift region and the column region are formed by ion-implanting impurities into the substrate, the electric field relaxation region being at least disposed on a side surface of the column region facing the second main electrode via the drift region, and wherein the respective regions of the semiconductor layer are formed of a same material.

14. The semiconductor device of claim 6, wherein the control electrode comprises silicon carbide, SiGe or Al.

* * * * *